(12) United States Patent
Bhatia et al.

(10) Patent No.: US 8,947,826 B2
(45) Date of Patent: Feb. 3, 2015

(54) SURFACE TREATMENT METHOD TO DEVELOP A DURABLE WEAR RESISTANT OVERCOAT FOR MAGNETIC RECORDING SYSTEMS

(75) Inventors: Charanjit Singh Bhatia, Singapore (SG); Ehsan Rismani-Yazdi, Singapore (SG); Sujeet Kumar Sinha, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 13/821,236

(22) PCT Filed: Sep. 7, 2011

(86) PCT No.: PCT/SG2011/000304
§ 371 (c)(1),
(2), (4) Date: Mar. 6, 2013

(87) PCT Pub. No.: WO2012/033465
PCT Pub. Date: Mar. 15, 2012

(65) Prior Publication Data
US 2013/0163117 A1    Jun. 27, 2013

Related U.S. Application Data

(60) Provisional application No. 61/380,393, filed on Sep. 7, 2010.

(51) Int. Cl.
*G11B 5/187*    (2006.01)
*G11B 5/84*     (2006.01)
(Continued)

(52) U.S. Cl.
CPC .............. *C23C 14/48* (2013.01); *G11B 5/8408* (2013.01); *G11B 5/72* (2013.01)
USPC ............ 360/122; 427/523; 427/532; 427/533

(58) Field of Classification Search
USPC ................... 427/249.1, 249.5, 249.7, 249.15, 427/249.17–249.19, 532, 533, 534, 569, 427/523; 204/192.11, 192.12, 192.15, 204/192.16, 192.38; 360/122
See application file for complete search history.

(56) References Cited

U.S. PATENT DOCUMENTS 5,838,522 A * 11/1998 Komvopoulos et al. ...... 360/122
6,086,796 A    7/2000 Brown et al.
(Continued)

FOREIGN PATENT DOCUMENTS

JP    63171421 A  *  7/1988
JP    04017116 A  *  1/1992
(Continued)

OTHER PUBLICATIONS

Foreign Communication from a Related Counterpart Application, International Preliminary Report on Patentability dated Mar. 21, 2013, International Application Serial No. PCT/SG2011/000304 filed on Sep. 7, 2011.
(Continued)

*Primary Examiner* — Will J Klimowicz

(57) ABSTRACT

A durable wear-resistant coating consists of an atomically mixed layer on the surface of the head or media which is developed by bombardment of the surface with energetic C ions with optimized parameters. This mixed layer is covered with a hard DLC overcoat. This mixed interlayer is able to strongly bond the overcoat to the head or media substrate and improve the tribological properties of the overcoat. In this method a very thin layer of a carbide former material can be used as an interlayer before bombarding the surface with C ions which provides a composite interlayer containing C and species from interlayer and substrate. This composite interlayer bonds the DLC overact to the ceramic substrate of the head or the metallic substrate of the media. This interlayer by itself is protective enough to protect the head media of the hard drives against wear and corrosion.

13 Claims, 5 Drawing Sheets

(51) Int. Cl.
*G11B 5/72* (2006.01)
*C23C 14/00* (2006.01)
*C23C 14/48* (2006.01)

(56) References Cited

U.S. PATENT DOCUMENTS

| | | |
|---|---|---|
| 6,572,958 B1 | 6/2003 | Chour et al. |
| 6,603,637 B1* | 8/2003 | Segar et al. ............... 360/122 |
| 6,902,773 B1* | 6/2005 | Pocker et al. ............. 427/523 |
| 2009/0109581 A1* | 4/2009 | Fukuzawa et al. ....... 360/324.12 |
| 2013/0163119 A1* | 6/2013 | Bhatia et al. ............. 360/234 |

FOREIGN PATENT DOCUMENTS

| | | |
|---|---|---|
| JP | 2001297410 A | 10/2001 |
| WO | 2012033465 A1 | 3/2012 |

OTHER PUBLICATIONS

Foreign Communication From a Related Counterpart Application, International Search Report and Written Opinion dated Nov. 23, 2011, International Application No. PCT/SG2011/000304, filed on Sep. 7, 2011.

* cited by examiner

Intermixed layer between DLC and AlTiC substrate

Formation of a mixed layer at the interface between DLC and the AlTiC substrate

SURFACE TREATMENT METHOD TO DEVELOP A DURABLE WEAR RESISTANT OVERCOAT FOR MAGNETIC RECORDING SYSTEMS

CROSS-REFERENCE TO RELATED APPLICATIONS

This application is a filing under 35 U.S.C. 371 as the National Stage of International Application No. PCT/SG2011/000304, filed Sep. 7, 2011, entitled "A SURFACE TREATEMENT METHOD TO DEVELOP A DURABLE WEAR RESISTANT OVERCOAT FOR MAGNETIC RECORDING SYSTEM," which claims the benefit of and priority to U.S. Provisional Patent Application No. 61/380,393, filed Sep. 7, 2010 and entitled "A SURFACE TREATEMENT METHOD TO DEVELOP A DURABLE WEAR RESISTANT OVERCOAT FOR MAGNETIC RECORDING SYSTEM", both of which are incorporated herein by reference in their entirety for all purposes.

FIELD OF THE INVENTION

The present invention relates to a magnetic recording system.

BACKGROUND OF THE INVENTION

Electronic data is commonly stored using magnetic storage systems such as hard disk drives or magnetic tape drives. Such magnetic storage systems typically comprise a magnetic medium and a read-write head. Surfaces of the magnetic medium and the head may need to be protected against corrosion, mechanical damage (wear) and/or to reduce friction. Conventionally in hard drives this protection may be provided by coating these surfaces with a hard protective layer and a lubricant layer. However in magnetic tape drives the protection of the head continues to be a problem due to the continuous contact of the tape with the head. In a magnetic tape drive, fabricating a protective film is difficult, as adhesion to the substrate is complicated by the continuous contact of the tape.

SUMMARY OF THE INVENTION

In general terms the invention relates to bombarding a substrate of a magnetic recording system with energetic ions to form a mixed layer on the substrate surface. This may improve adhesion to a protective overcoat such as DLC. The substrate may be a read write head of a magnetic tape drive. The substrate may alternatively be a head or magnetic media of a hard disk drive.

In a first specific expression of the invention there is provided a method of treating a magnetic tape drive head, comprising:
providing head including a substrate; and
bombarding the substrate with a plurality of ions to form an intermixed layer.

In a second specific expression of the invention there is provided a magnetic tape drive system comprising:
a head including a substrate; and
an intermixed layer merged with the substrate, the intermixed layer having a thickness of less than about 5 nanometers (nm).

Other aspects and advantages of the invention will become apparent from the following detailed description, taken in conjunction with the accompanying drawings, illustrating by way of example the principles of the invention.

BRIEF DESCRIPTION OF THE DRAWINGS

The following detailed description of preferred embodiments of the invention will be better understood when read in conjunction with the appended drawings, in which.

DETAILED DESCRIPTION

Figure 1:
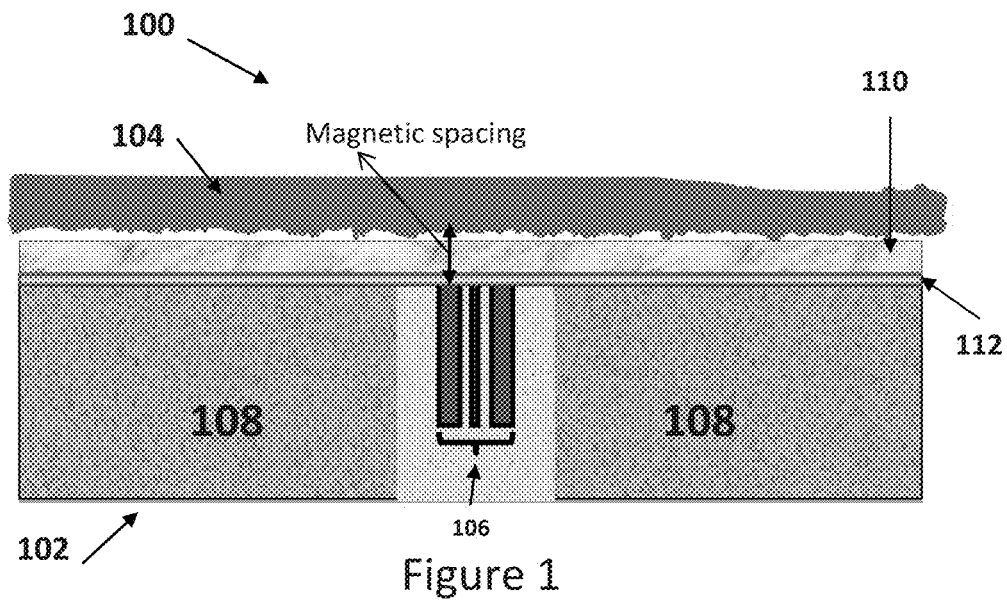
FIG. 1 is a cross section of head/tape interface in a magnetic tape drive according to a first embodiment of the invention.
Figure 2:
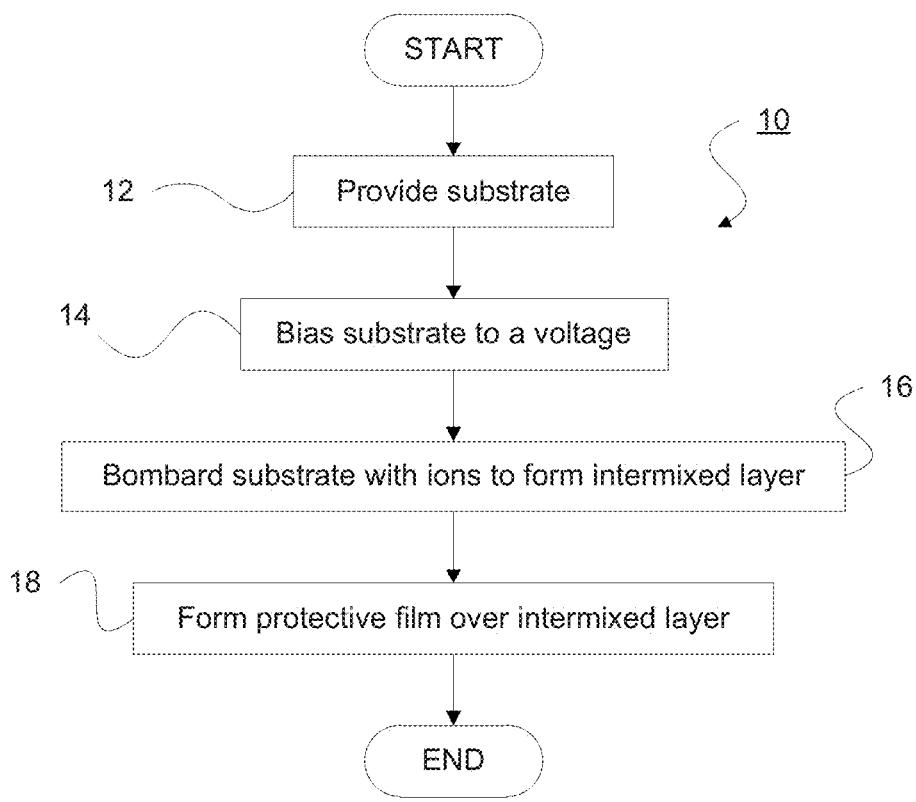
FIG. 2 is a flowchart of a method of treating a substrate in accordance with the first embodiment.

Referring to FIG. 1 a magnetic tape drive system 100 is illustrated. The head 102 is shown in contact with tape 104. The head includes read write elements 106 surrounded by an AlTiC substrate 108. The read write elements 106 and the substrate 108 are protected from the tape by protective overcoat 110. An intermixed layer 112 is provided between the protective overcoat 110 and the read write elements 106 and substrate 108 respectively, to increase adhesion as will be described later.

A method 10 of surface treating the head is shown in FIG. 1 according to the first embodiment. The head is provided 10 including the $Al_2O_3$—TiC (AlTiC) substrate and the read write elements mentioned above. The substrate is then biased 12 to a voltage to be bombarded 16 with a plurality of ions from a plasma source to form an intermixed layer. Then a protective overcoat is formed 18 over the intermixed layer.

The depth and quality of the intermixed layer, may be controlled by the ion energy (amplitude of the bias voltage) the implantation dose (ion density) and period of bombardment. For example in some applications the intermixed layer may be less than 2 nm.

The substrate may be biased 12 at a voltage according to the deposition system used to achieve an ion energy of between 200 eV to 1000 eV. For example the ion energy may be about 350 eV.

The substrate may be bombarded 14 with a broad beam of energetic ions from a plasma source (eg: filtered cathodic vacuum arc FVCA). The ions are accelerated towards the surface of the substrate. The ions impinging on the solid surface at high energy become buried or embedded into the outermost surface to a certain depth depending on the ion energy and material as well as the surface composition. The ions may be $C^+$ ions at an energy of between 200 to 1000 eV for a period of between 10 to 120 seconds.

Advantageously, biasing the substrate to a high voltage at this initial stage of deposition results in high ion energy and this in turn leads to a good intermixing and may promote better adhesion to subsequent layers.

Furthermore, bombarding the surface with energetic ions leads to direct and recoil implantation and intermixing of the impinging ions and existing species near the outermost of the surface. This surface treatment results in the modification of the atomic composition and lattice structure of the near-surface region without affecting the bulk material properties. Thus the optimum depth of the intermixed layer may depend on the substrate and the application.

The protective coating may be formed 18 over the intermixed layer by applying a lower negative bias voltage (pulsed bias is an option which may improve the quality of the overcoat) resulting in a lower ion energy level of between 80-120 eV. For example for carbon deposited by FCVA an ion energy of about 100 eV may be used. The same plasma source and type of ions may be used, and the period of deposition depends on the final overcoat thickness, the deposition rate and the deposition tool used. This leads to formation of a hard film for example a diamond like carbon (DLC) layer. The overcoat can potentially be any hard, smooth, inert and continuous material. However, the ions used to create the intermixed layer and parameters should be selected properly to be consistent with the overcoat material. The ion energy in this stage is lower to give the best coating mechanical properties. By adjusting the ion energy level (vis the amplitude of the applied voltage), and the frequency and the duty cycle of the substrate pulsed bias voltage, the properties of the protective coating can be optimised.

Increased solid solubility of condensable species is obtained from the recoil collision cascades and interface tailoring on an atomic scale is achieved from the mixing of the film and substrate materials. Intermixing greatly enhances the film adhesion and reduces stresses due to lattice mismatches.

The growth mechanism of DLC films occurs with subplantation of incident ions. Subplantation creates a metastable increase in density, which tends to cause the local bonding to change to $sp^3$. The DLC may be alloyed with an element selected from a group comprising chromium, tungsten, titanium, boron and silicon. Advantageously, certain mechanical properties of the protective coating such as, for example, fracture toughness or chemical stability are improved by alloying the coating with some other metallic or non-metallic materials.

The thickness of the overcoat layer may be controlled by the ion dose (ion density) and deposition time. The overcoat layer may be formed to a thickness of less than about 20 nm, and preferably between 5-17 nm.

The method 10 may improve the adhesion of DLC films of less than 20 nm thickness to an $Al_2O_3$—TiC (AlTiC) substrate, enabling the coating to survive in the harsh contact situation at the Head/Tape Interface (HTI) for the life of the head in a magnetic tape drive.

The protective coating should be as thin as possible to reduce the head and tape spacing, thus allowing for increased recording density.

Figure 3:
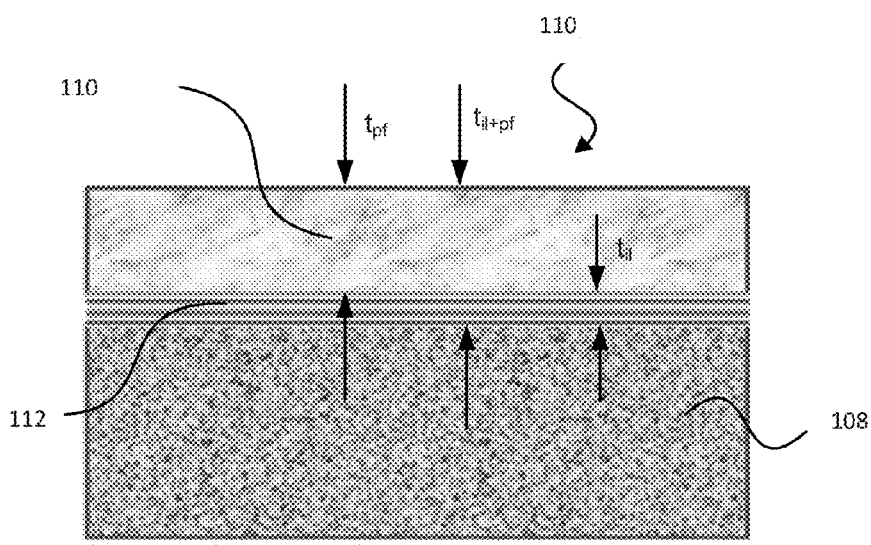
FIG. 3 is a schematic diagram of a cross section of a substrate treated in accordance with the method shown in FIG. 2.

A cross section of the head 102 treated in accordance with the method 10 is shown in FIG. 3. The intermixed layer 112 has a thickness $t_{il}$ of between a couple of atomic layers to 5 nm. The protective coating 110 has a thickness $t_{pf}$ of up to 20 nm.

Figure 4A:
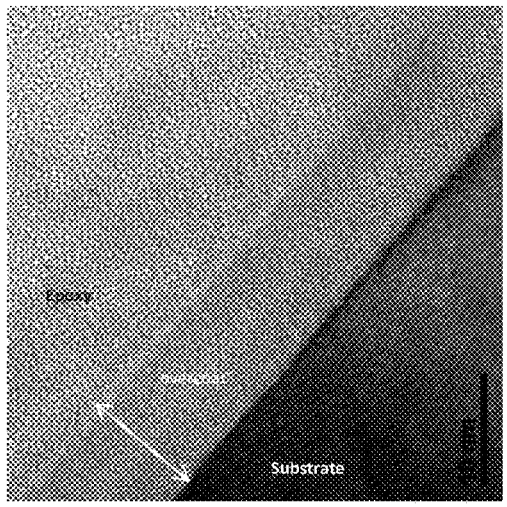
FIG. 4A is a transmission electron microscopy (TEM) micrograph of a substrate without treatment (bombardment with energetic ions) in accordance with the method shown in FIG. 2.
Figure 4B:
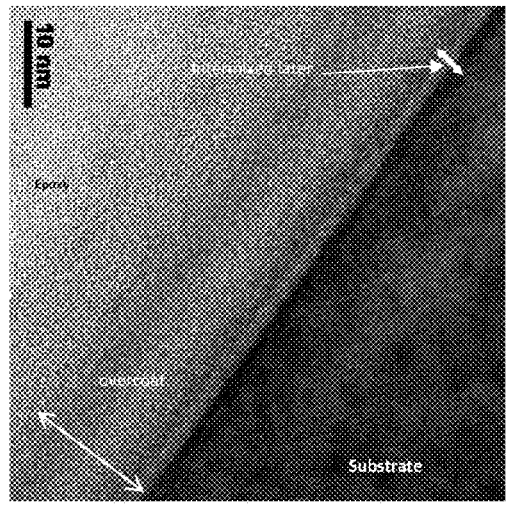
FIG. 4B is a transmission electron microscopy (TEM) micrograph of a substrate with treatment (with bombardment with energetic ions) in accordance with the method shown in FIG. 2.

FIG. 4B shows transmission electron microscopy (TEM) micrographs of a substrate treated in accordance with the method 10. There is ion mixing between the substrate 32 and the protective coating 36 resulting in better adhesion, clearly showing the intermixed layer. FIG. 4A shows that deposition of a DLC overcoat on a head substrate, without pre-treatment (without bombardment with energetic ions). In that case the interface between the DLC film and the substrate is very sharp and there is no mixed layer between the substrate and the overcoat.

Figure 5:
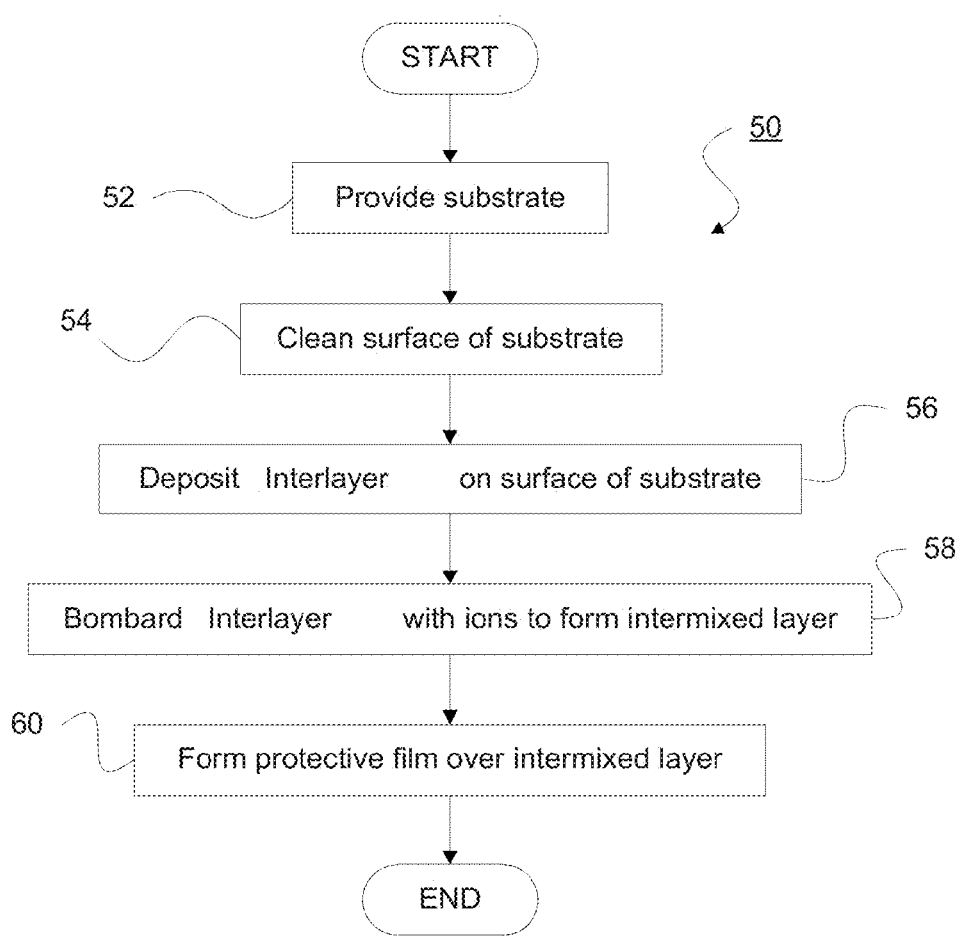
FIG. 5 is a flowchart of a method of treating a substrate in accordance with a second embodiment.

A method 50 of surface treating the head is shown in FIG. 5 according to the second embodiment. First a head including a substrate is provided 52 as before. Then the surface of the substrate is cleaned 54. An interlayer is deposited 56 on the surface of the substrate. The interlayer is then bombarded 58 with a plurality of ions to form an intermixed layer. Then a protective overcoat is formed 60 over the intermixed layer.

The cleaning 54 of the substrate uses Ar plasma with optimized parameters which are able to clean and activate the surface without changing the surface topography very much.

The interlayer may be deposited 56 on the surface of the substrate by sputtering. The thickness of interlayer is between a few angstroms to 2 nm.

In a preferred embodiment, the interlayer includes silicon, boron, chromium, tungsten, or titanium prior to bombardment. The interlayer can also be termed a carbide former layer, since the bombardment by $C^+$ ions of the interlayer will consequently form carbides. Due to the bombardment of C+ ions, the existing species on the substrate surface may react with C+ ions thus becoming an intermixed layer. Other than pure interlayer materials such as Si, B, Cr, Ti, etc, compounds of these materials with other elements can also be used as the interlayer. Some examples include (but are not limited to) $SiC_xN_y$, or $SiB_xC_yN_z$, wherein x, y and z determine the fraction of different elements in the compounds that are used as the interlayer are.

In the case of surface treatment of a magnetic media (such as the platter in a hard drive), a magnetic material may be deposited on the substrate concurrently with the deposition of the interlayer on the surface of the substrate. That is, deposition of the interlayer can be started while deposition of the magnetic media (i.e., the magnetic material of the disk) is being performed. This means that while deposition of the magnetic material (e.g., cobalt (Co), iron platinum (FePt), etc.) has not finished, deposition of the interlayer is started such that the interlayer and its underlying magnetic material are mixed with each other. The mixing time and the fraction of each component in this mixing layer are adjustable and may be optimized based on specific requirements.

The bombarding 58 of the interlayer is first done with Ar+ ions and then with C+ ions. The energy level is between 200 to 1 keV. The ion density and duration of bombardment directly depends on the tool which generates the plasma. These parameters vary by the deposition tool and should be optimized for any specific deposition system.

Advantageously, modification of the surface properties of the media or head surface by formation of an atomic mixing layer on the outermost surface of the substrate improves the tribological behaviour such as wear resistance of the substrate and also enhances its resistance to corrosion. In other words, the surface modification is able to independently protect the surface of the substrate against wear and corrosion.

The use of an overcoat over the intermixed layer is optional (especially for hard disk media and hard drive heads). The forming 60 of protective overcoat may be conducted by filtered cathodic vacuum arc (FCVA), pulsed laser deposition (PLD) or plasma-enhanced chemical vapor deposition (PECVD).

Figure 7:
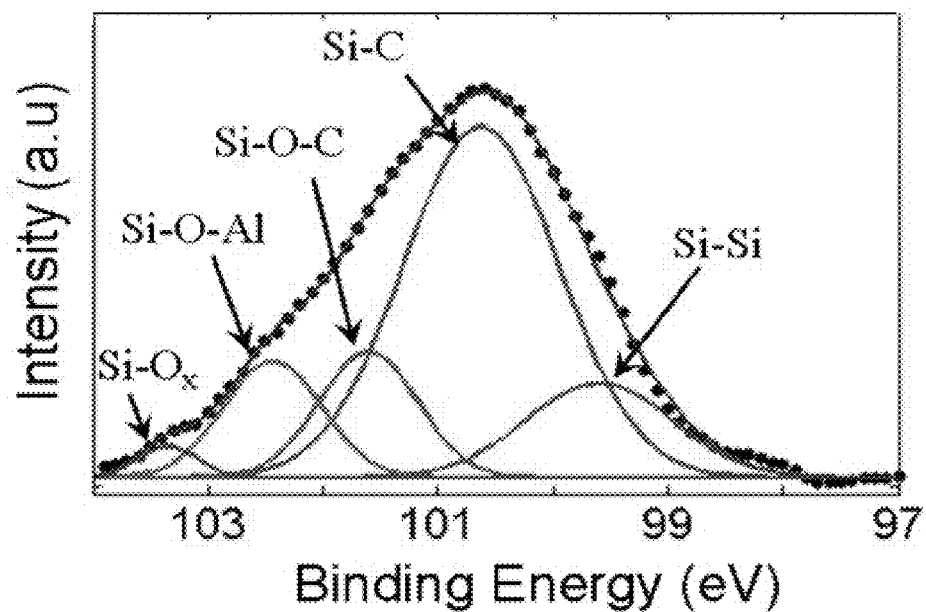
FIG. 7 shows X-ray photoelectron spectroscopy (XPS) spectra of the intermixed layer treated in accordance with the method shown in FIG. 5

As an example, the method 50 was tested on a surface of a tape drive head material made of an AlTiC ceramic consisting of $Al_2O_3$ and TiC. A Si intermixed layer is used. Chemical characterization of the thin diamond-like carbon coatings and the interface mixing layer revealed formation of an overcoat of high C—C sp3 (approximately 80% diamond like bonds) as well as the formation of a mixed layer between DLC/Si/AlTiC consisting of Si—C (58%), Al—O—Si (13%), Si—O—C (12%) and Si—Si (14%) bonds. This is shown in FIG. 7, where the XPS Si2p peak of the interlayer of pre-treated sample (with composite interlayer) illustrated. Deconvolution of this spectrum led to a dominant concentration of Si—C (58.2%) and a weaker concentration of Si—Si (14.6%), indicating that the interlayer of the pre-treated sample consisted primarily of Si—C bonds. Formation of the strong Si—C bonds creates a strong covalent network between the DLC overcoat and the interlayer which significantly improves the durability and adhesion of the DLC to the interlayer. This result also showed considerable amount of Si—O—C (13.1%) and Al—O—Si (12.1%) bonds formed between the impinging carbon ions, Si atoms of interlayer and Al and O atoms from the AlTiC substrate. Formation of these species chemically attach the interlayer to the substrate by means of very strong covalent bonds and improves the adhesion of the interlayer to the substrate.

Figure 8:
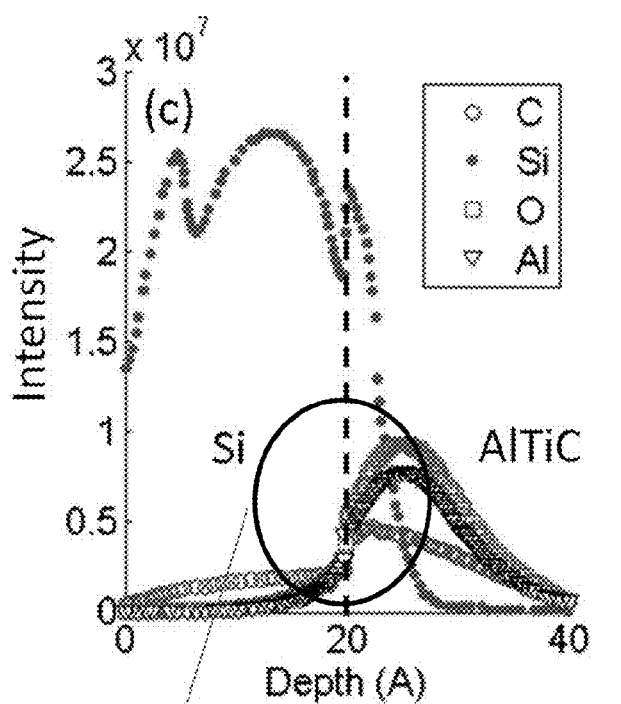
FIG. 8 is a TRIM simulation showing the formation of the intermixed layer.

Results from Transport and Range of Ions in Matter (TRIM) simulations were used to verify the formation of an atomic mixing layer between the ta-C overcoat, the Si interlayer and the AlTiC substrate. This is shown in FIG. 8. This result is in agreement with the experimental XPS results and confirms the formation of an atomically mixed layer between the DLC overcoat, the interlayer and the substrate of the head.

Figure 9:
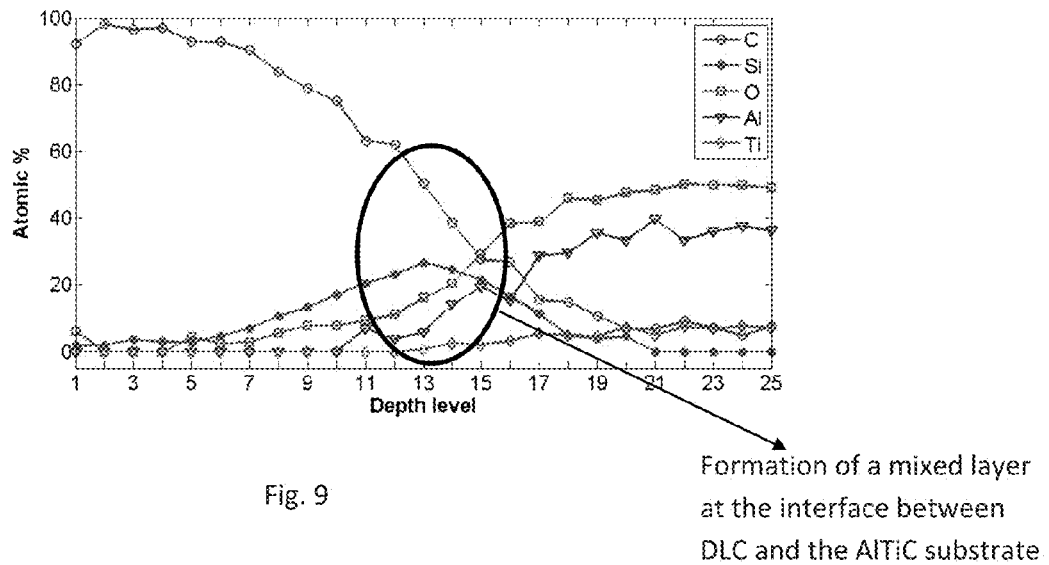
FIG. 9 is a graph showing the composition of the substrate according to depth.

The possibility of the formation of an intermixed layer at the AlTiC/Si/DLC interface due to bombardment by energetic ions was further examined by XPS depth profiling shown in FIG. 9. In XPS depth profile, the top layer consists of about 100% C, indicating the DLC overcoat. The intermixed layer can be determined as a region 20 with a higher atomic concentration of Si. As can be seen in FIG. 9, there were no well-defined DLCC/Si or Si/AlTiC margins. In addition to Si, the intermixed layer consisted of considerable amounts of C, Al, and O atoms. This result indicated the embedment of C+ ions into the interface and confirmed the formation of an atomic mixing layer at the AlTiC/Si/DLC interface predicted by SRIM simulation.

Figure 10:
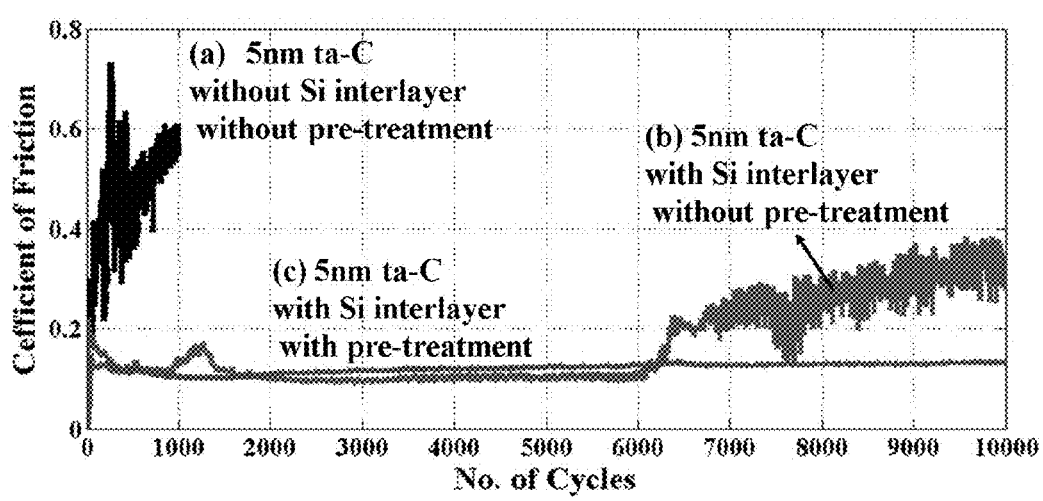
FIG. 10 is a graph showing the failure times of prior art devices compared to the second embodiment.

The nano-tribological properties of the treated surfaces were investigated and the results suggest a significant improvement in adhesion and tribological properties of the protective coating after surface treatment. The samples without treatment failed immediately, whereas the treated surfaces showed a very low coefficient of friction for more than 10,000 cycles without failure as shown in FIG. 10.

From the obtained results (one of the examples in which Si was used as an interlayer), it can be concluded that the formation of a SiC network with strong covalent bonds between the DLC layer and the Si interlayer improves the adhesion of the DLC film to the mixed layer and reduces the lattice mismatches between the amorphous DLC coating and the substrate. This also promotes the formation of sp3 bonds between carbon atoms which directly determines the mechanical properties of the coating. In addition SiC itself is a very hard material which can effectively protect the surface against wear and impact damages even without the provision of an overcoat. Furthermore, formation of the Si—O—Al bonds causes the interlayer to be strongly attached to the underlying AlTiC substrate. Therefore, the total adhesion of the film and the substrate and the mechanical properties of the substrate surface are significantly improved.

The method 50 can be used to improve the surface properties of ultra-thin DLC coatings on the surface of the magnetic disks and recording heads of hard drives with extremely high recording density when the thickness of the DLC overcoat is decreased or when the DLC overcoat is eliminated. The method 50 can also be used to develop wear resistant overcoat-free magnetic media or heads for the next generation of magnetic hard disks by decreasing the head media spacing and increasing the recording density.

In comparison with other methods to improve the adhesion of DLC films to the head or other surfaces, the method 50 is able to form a composite intermixing layer containing hard carbides such as SiC, CrC or Boron carbide (due to the bombarding step with C and Ar ions) which is hard and protective in itself. This composite layer is strongly bonded by covalent bond (for example Al—O—Si) to the substrate from one side and by carbide bonds (such as Si—C, Cr—C, B—C) to the overcoat from the other side and significantly increases the adhesion between the overcoat and the substrate and improves the durability of the coating on head or media.

Figure 6:
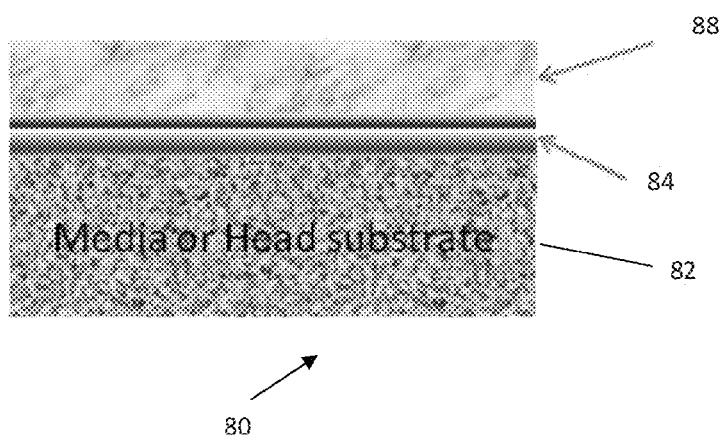
FIG. 6 is a schematic diagram of a cross section of a substrate treated in accordance with the method shown in FIG. 5.

Referring now to FIG. 6, a cross section of a head 80 treated in accordance with the method 50 is shown. The head 80 includes a substrate 82, an intermixed layer 84 on a surface of the substrate 82, and a protective coating 88 over the intermixed layer 84.

While the preferred embodiments of the invention have been illustrated and described, it will be clear that the invention is not limited to these embodiments only. Numerous modifications, changes, variations, substitutions and equivalents will be apparent to those skilled in the art without departing from the scope of the invention as described in the claims. For example as mentioned the method can equally apply to treating the surface of a HDD head or magnetic media. Thus the intermixed layer can also be formed as part of other magnetic data storage systems or applied to any substrate requiring corrosion or mechanical protection, improvement in adhesion or reduction in friction.

Further, unless the context clearly requires otherwise, throughout the description and the claims, the words "comprise", "comprising" and the like are to be construed in an inclusive as opposed to an exclusive or exhaustive sense; that is to say, in the sense of "including, but not limited to".

The invention claimed is:

1. A method of treating the surface of a magnetic tape drive head, comprising:
   providing the head including a substrate;
   bombarding the substrate with a plurality of ions at a first ion energy to form an intermixed layer, and
   forming a protective overcoat on the intermixed layer at a second ion energy, wherein forming the protective overcoat on the intermixed layer comprises depositing a material on the intermixed layer at the second ion energy, wherein the protective overcoat comprises a hard film formed on the intermixed layer, and wherein the first ion energy is higher than the second ion energy.

2. The method of claim 1, wherein providing the substrate includes forming an interlayer on the substrate, wherein the interlayer is subsequently bombarded to form the intermixed layer.

3. The method of claim 2, wherein the interlayer is less than about 5 nm thick.

4. The method of claim 2, wherein the interlayer comprises a selection from a group comprising silicon, boron, chromium, tungsten, titanium, a nitride thereof, and any combination thereof.

5. The method of claim 2, further comprising cleaning the surface of the substrate prior to forming the interlayer.

6. The method of claim 2, wherein forming the interlayer comprises sputtering a carbide former material on the substrate.

7. The method of claim 1, wherein the intermixed layer is less than about 5 nanometers (nm) thick.

8. The method of claim 1, wherein the protective overcoat is less than about 20 nanometers (nm) thick.

9. The method of claim 1, wherein the protective overcoat is diamond like carbon (DLC) or DLC and an element selected from a group comprising chromium, tungsten, titanium, boron and silicon.

10. The method of claim 1, wherein bombarding comprises bombarding the substrate with carbon ions.

11. The method of claim 10, wherein bombarding further comprises bombarding the substrate with argon ions prior to bombardment with carbon ions.

12. The method of claim 1, wherein the bombarding uses a filtered cathodic vacuum arc process having an ion energy of between about 200 eV to 1000 eV.

13. The method of claim 1, wherein forming the protective overcoat comprises deposition of carbon using a filtered cathodic vacuum arc process with an ion energy of between about 80-120 eV.

* * * * *